(12) United States Patent
Nielsen et al.

(10) Patent No.: US 11,543,482 B2
(45) Date of Patent: Jan. 3, 2023

(54) MAGNETIC RESONANCE IMAGING USING MOTION-COMPENSATED IMAGE RECONSTRUCTION

(71) Applicant: KONINKLIJKE PHILIPS N.V., Eindhoven (NL)

(72) Inventors: Tim Nielsen, Hamburg (DE); Jan Hendrik Wuelbern, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 0 days.

(21) Appl. No.: 17/285,115

(22) PCT Filed: Oct. 14, 2019

(86) PCT No.: PCT/EP2019/077786
§ 371 (c)(1),
(2) Date: Apr. 14, 2021

(87) PCT Pub. No.: WO2020/078907
PCT Pub. Date: Apr. 23, 2020

(65) Prior Publication Data
US 2021/0356547 A1 Nov. 18, 2021

(30) Foreign Application Priority Data
Oct. 16, 2018 (EP) .................................... 18200643

(51) Int. Cl.
*G01V 3/00* (2006.01)
*G01R 33/565* (2006.01)
(Continued)

(52) U.S. Cl.
CPC ..... *G01R 33/56509* (2013.01); *G01R 33/385* (2013.01); *G01R 33/4822* (2013.01);
(Continued)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

| 7,039,451 B1 | 5/2006 | Jhooti et al. |
| 2014/0029824 A1 | 1/2014 | Shi et al. |

(Continued)

FOREIGN PATENT DOCUMENTS

| AU | 2004203173 A1 * | 2/2005 | ............. A61B 19/52 |
| CN | 102934143 A * | 2/2013 | ........... G01R 33/481 |

(Continued)

OTHER PUBLICATIONS

Winkelmann et al. "An Optimal Radial Profile Order Based on the Golden Ratio for Time Resolved MRI" IEEE Trans. Med. Im. 26 (2007) p. 68-76.

(Continued)

*Primary Examiner* — Walter L Lindsay, Jr.
*Assistant Examiner* — Frederick Wenderoth

(57) ABSTRACT

The invention relates to a method of MR imaging of an object (10). It is an object of the invention to enable MR imaging in the presence of motion of the imaged object, wherein full use is made of the acquired MR signal and a high-quality MR image essentially free from motion artefacts is obtained. The method of the invention comprises the steps of: generating MR signals by subjecting the object (10) to an imaging sequence comprising RF pulses and switched magnetic field gradients; acquiring the MR signals as signal data over a given period of time (T); subdividing the period of time into a number of successive time segments (SO, S1, S2, . . . Sn); deriving a geometric transformation (DVF1, DVF2, . . . DVFn) in image space for each pair of consecutive time segments (S0, S1, S2, . . . Sn), which geometric (Continued)

transformation (DVF1, DVF2, . . . DVFn) reflects motion occurring between the two time segments of the respective pair; and reconstructing an MR image from the signal data, wherein a motion compensation is applied according to the derived geometric transformations (DVF1, DVF2, . . . DVFn). Moreover, the invention relates to an MR device (1) and to a computer program for an MR device (1).

20 Claims, 2 Drawing Sheets

(51) Int. Cl.
    *G01R 33/385*    (2006.01)
    *G01R 33/48*     (2006.01)
    *G01R 33/56*     (2006.01)
    *G01R 33/561*    (2006.01)
    *G01R 33/567*    (2006.01)

(52) U.S. Cl.
    CPC ...... *G01R 33/5608* (2013.01); *G01R 33/5611* (2013.01); *G01R 33/5676* (2013.01)

(58) Field of Classification Search
    USPC .......................................................... 324/309
    See application file for complete search history.

(56) References Cited

U.S. PATENT DOCUMENTS

| | | | | |
|---|---|---|---|---|
| 2014/0073907 | A1* | 3/2014 | Kumar | A61B 34/10 600/407 |
| 2014/0296700 | A1* | 10/2014 | Gulani | G01R 33/4822 600/414 |
| 2015/0077112 | A1 | 3/2015 | Otazo et al. | |
| 2015/0309135 | A1 | 10/2015 | Axel et al. | |
| 2016/0199004 | A1 | 7/2016 | Meyer et al. | |
| 2016/0324500 | A1 | 11/2016 | Fan et al. | |
| 2017/0192074 | A1 | 7/2017 | Seethamraju et al. | |
| 2017/0328970 | A1 | 11/2017 | Bi et al. | |
| 2021/0003653 | A1 | 1/2021 | Wulbern et al. | |

FOREIGN PATENT DOCUMENTS

| | | | | |
|---|---|---|---|---|
| CN | 106030329 | A * | 10/2016 | ......... G01R 33/4818 |
| WO | WO-2007012997 | A2 * | 2/2007 | ............... G06T 7/12 |
| WO | 2013159044 | A1 | 10/2013 | |

OTHER PUBLICATIONS

Pruessmann et al. "Advances in Sensitivity Encoding With Arbitrary K-Space Trajectories" Magn. Reson Med. 2001 vol. 46, pp. 638-651.

M. Salman Asif et al "Motion Adaptive Spatio-Temporal Regularization for Accelerated Dynamic MRI" Magn. Reson. Med. vol. 70, No. 3, Nov. 6, 2012 p. 800-812.

Anderson et al "Retrospective Registration Based MRI Motion Correction With Interleaved Radial Trajectories" 2011 8th IEEE International Symposium on Biomedical Imaging Mar. 30, 2011, p. 1528-1531.

Kolbitsch et al. "T1-and T2 Weighted MR Acquisition for Bulk Motion Correction for Simultaneous PET-MR" Proceedings of the International Soc. for Magn. Res. in Med. Apr. 20-26, 2013.

Rank et al "4D Respiratory Motion Compensated Image Reconstruction of Free-Breathing Radial MR Data With Very High Undersampling" Mag. Reson. in Med. vol. 77, No. 3, Mar. 16, 2016 p. 1170-1183.

International Search Report and Written Opinion From PCT/EP2019/077786 dated Apr. 23, 2020.

Li Feng, Chenchan Huang, Krishna Shanbhogue, Daniel K Sodickson, Hersh Chandarana, and Ricardo Otazo. "Racer-grasp: Respiratory-weighted, aortic contrast enhancement-guided and coil-unstreaking golden-angle radial sparse mri." Magnetic Resonance in Medicine (2017).

Li Feng, Leon Axel, Hersh Chandarana, Kai Tobias Block, Daniel K. Sodickson, and Ricardo Otazo. "XD-GRASP: Golden-angle radial MRI with reconstruction of extra motion-state dimensions using compressed sensing." Magnetic Resonance in Medicine, 75(2):775_788, 2016.

* cited by examiner

MAGNETIC RESONANCE IMAGING USING MOTION-COMPENSATED IMAGE RECONSTRUCTION

CROSS REFERENCE TO RELATED APPLICATIONS

This application is a U.S. national phase application of International Application No. PCT/EP2019/077786 filed on Oct. 14, 2019, which claims the benefit of EP Application Serial No. 18200643.7 filed on Oct. 16, 2018 and is incorporated herein by reference.

FIELD OF THE INVENTION

The invention relates to the field of magnetic resonance (MR) imaging. It concerns a method of MR imaging of an object placed in the examination volume of an MR device. The invention also relates to an MR device and to a computer program to be run on an MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for the imaging of soft tissue they are superior to other imaging methods in many respects, do not require ionizing radiation and are usually not invasive.

According to the MR method in general, the body of the patient to be examined is arranged in a strong, uniform magnetic field $B_0$ whose direction at the same time defines an axis (normally the z-axis) of the co-ordinate system to which the measurement is related. The magnetic field $B_0$ produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse) while the corresponding magnetic field $B_1$ of this RF pulse extends perpendicular to the z-axis, so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the magnetization is deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second and shorter time constant $T_2$ (spin-spin or transverse relaxation time). The transverse magnetization and its variation can be detected by means of receiving RF coils which are arranged and oriented within an examination volume of the MR device in such a manner that the variation of the magnetization is measured in the direction perpendicular to the z-axis. The decay of the transverse magnetization is accompanied by dephasing taking place after RF excitation caused by local magnetic field inhomogeneities facilitating a transition from an ordered state with the same signal phase to a state in which all phase angles are uniformly distributed. The dephasing can be compensated by means of a refocusing RF pulse (for example a 180° pulse). This produces an echo signal (spin echo) in the receiving coils.

In order to realize spatial resolution in the body, time-varying magnetic field gradients extending along the three main axes are superposed on the uniform magnetic field $B_0$, leading to a linear spatial dependency of the spin resonance frequency. The signal picked up in the receiving coils then contains components of different frequencies which can be associated with different locations in the body. The signal data obtained via the receiving coils correspond to the spatial frequency domain and are called k-space data. The k-space data usually include multiple lines acquired of different phase encoding. Each line is digitized by collecting a number of samples. A set of k-space data is converted to an MR image by means of Fourier transformation.

Motion during MR signal data acquisition is a source of various image artefacts. One way to reduce motion artefacts is to modify the acquisition in such a way that data are acquired in the same motion state by gating or triggering or by asking the patient to hold their breath. These methods all have the disadvantage that they reduce scan efficiency and require patient cooperation.

Another way to reduce motion artefacts is to use dedicated reconstruction algorithms which account for motion as part of the reconstruction model.

Moreover, gating techniques have been developed accepting only MR signal data acquired within a certain predefined respiratory gating window. A multi-gating window approach (referred to as PAWS, see U.S. Pat. No. 7,039,451 B1) has been proposed using a number of individual motion states (bins) rather than one pre-defined gating window. Each of the motion states corresponds to one of a plurality of contiguous ranges of motion-induced displacements of the body under examination. The final MR image in PAWS is reconstructed from the MR signal data attributed the motion state for which a complete set of MR signal samples is acquired first. Motion binning can be controlled by one or more navigator signals which can be derived in many different ways, e.g. from a central k-space navigator, a pencil-beam navigator, from an ECG signal, from a breathing belt, a camera, etc.

One disadvantage of the afore-described binning approach is that attributing MR signal data to a certain motion state is a difficult signal processing task. Moreover, binning data into different motion states often fails in practice because the actual motion does not correspond to the model of quasi-periodic motion. Confounding factors are, e.g., drift, incidental gross motion, and transitions between different breathing patterns, which may not be picked up well by the navigator signals.

Another disadvantage of the binning approach is that some bins always contain more data than others. I.e., the signal to noise ratio/artefact level of the images from different bins may vary widely. Often many bins are filled to such a small extent that no useful image can be reconstructed at all for these bins. Hence, a considerable part of the MR signal data is essentially discarded in the reconstruction which renders the method ineffective. Due to this problem, it is practically impossible to fully image a continuous time course of the contrast agent dynamics in DCE ("Dynamic Contrast Enhancement") scans.

The paper 'An optimal radial profile order based on the golden ratio for time-resolved MRI' in IEEE Trans.Med.Im.

26(2007)68-76 by S. Winkelmann et al. mentions to reconstruct highly undersampled datasets for motion analysis and add motion corrected data retrospectively to obtain a morphologic image with higher spatial resolution.

SUMMARY OF THE INVENTION

From the foregoing it is readily appreciated that there is a need for an MR imaging technique with improved motion-compensation. It is consequently an object of the invention to enable MR imaging in the presence of motion of the imaged object, wherein full use is made of the acquired MR signal and a high-quality MR image essentially free from motion artefacts is obtained.

In accordance with the invention, a method of MR imaging of an object positioned in the examination volume of a MR device is disclosed. The method comprises the steps of:

generating MR signals by subjecting the object to an imaging sequence comprising RF pulses and switched magnetic field gradients;

acquiring the MR signals as signal data over a given period of time;

subdividing the period of time into a number of successive time segments;

deriving a geometric transformation in image space for each pair of consecutive time segments, which geometric transformation reflects motion occurring between the two time segments of the respective pair; and reconstructing an MR image from the signal data, wherein a motion compensation is applied according to the derived geometric transformations.

The invention provides a solution for the above object by subdividing the period over which signal data are acquired into a sequence of short time segments such that no or only negligible motion occurs within each time segment. Motion is determined as geometric transformations. This is based on the assumption that the difference of the patient position in adjacent time segments can be described by a geometric transformation in image space (e.g. a displacement vector field). This geometric transformation between the successive time segments is used according to the invention in the reconstruction by aligning the different motion states occurring over the full duration of the scan.

As a result, a high quality MR image containing contributions from the full signal data is obtained.

In addition to the MR image, the method of the invention yields geometric transformations reflecting the motion occurred during the scan. This allows transforming the MR image into all motion states of the different time segments.

Furthermore, the reconstruction can be carried out by corresponding application of the determined geometric transformations in the reconstruction procedure such that a MR image is reconstructed for any of the time segments. Hence, a high quality MR image can be reconstructed for every time segment and therefore motion state. Consequently, the method of the invention can be used for reconstructing a dynamic series of MR images.

While the afore-mentioned binning methods (e.g. PAWS) restrict the use to repetitive motion (breathing or cardiac), the approach of the invention is generally applicable to all types of motion, independent of the spatial or temporal characteristics.

The present invention acquires data portions, typically sampled from different portions of k-space, of magnetic resonance signals for successive time segments. Within each individual time segment motion can be neglected and motion between successive time segments is represented by a geometric transformation. For each instant of an individual time segment geometric transformation from each of the (other) time segments can be formed by composing geometric transformations between several pairs of successive time segments. For each instant, motion corrected data portions can be formed from the acquired data portions; the corrections follow directly from the applicable composite geometric transformations to the instant at issue from the data portions of other instants. Finally, for each instant a spatial high-resolution magnetic resonance image can be reconstructed from the properly corrected data portions for that instant. Hence, a dynamic series of spatial high-resolution diagnostic quality magnetic resonance images is obtained over the entire period of time formed by the collective successive time segments. Thus, for each instant a spatial high-resolution magnetic resonance image corresponds to a frame reconstructed from the data portion acquired at the instant and corrected data portions of other time segments. At individual time segments only a portion of k-space is sampled while the spatial high-resolution magnetic resonance image is reconstructed from a full k-space sampling from the collection of motion corrected data from the respective time segments. That is, the spatial high-resolution magnetic resonance image is corrected from inter frame motion that occurs within the sampling of k-space data from which the spatial high-resolution magnetic resonance image is reconstructed.

In a preferred embodiment of the invention, a low-resolution MR image is reconstructed for each time segment from the signal data attributed to the respective time segment, and the geometric transformations is derived as a displacement vector field by registering the low-resolution MR images of the respective pair with each other. Preferably, a radial or spiral acquisition strategy is used such that signal data from central k-space is available for each time segment, thus enabling the reconstruction of a low-resolution MR image.

In a preferred embodiment, an iterative reconstruction technique is applied for reconstructing the MR image, preferably in combination with parallel imaging. In parallel imaging techniques a set of RF coils having different spatial sensitivity profiles is used for MR signal acquisition. Parallel imaging allows a reduction of phase encoding steps and consequently decreases the scan time. In general, the essence of parallel imaging reconstruction is to solve a linear system of equations representing the encoding scheme, or more specifically, to inverse the generalized encoding matrix determined by the applied magnetic field gradient modulation and the coil sensitivity profiles. The dimension of encoding matrix is rather large, and straight-forward inversion is numerically prohibitive. One efficient way is to perform reconstruction iteratively, as proposed, e.g., by Pruessmann et al. (Magn. Reson. Med., 2001, vol. 46, pp. 638-651). In this technique, the large linear system of equations, on which the image reconstruction is based, is solved as a least-squares minimization problem (optionally employing a suitable regularization scheme) using a conjugate gradient iteration approach. The invention proposes to adapt this known iterative reconstruction scheme. The reconstruction iteratively refines the reconstructed MR image, wherein, sequentially for each time segment, the geometric transformation attributed to the respective time segment is applied and the MR image is brought into agreement with the signal data attributed to the respective time segment. By going through all time segments in this fashion, the complete signal data is used for iteratively reconstructing the MR image with intrinsic compensation of motion occurring during acquisition.

In a preferred embodiment of the method of the invention, an inconsistency of the MR signals attributed to each time segment is determined, wherein the period of time is subdivided into a larger number of shorter time segments if inconsistency is detected.

Moreover, the period of time may be subdivided into a larger number of shorter time segments if at least one of the derived geometric transformations indicates a too fast or too strong motion occurring between the two time segments of the respective pair. On the other hand, the period of time may be subdivided into a smaller number of longer time segments if the derived geometric transformations indicate that there is no or only an insignificant motion occurring between consecutive time segments. In this way, the geometric transformation information, optionally combined with the data consistency analysis, may advantageously be used to refine the initial subdivision into time segments. Depending on the motion occurring during MR signal acquisition, as indicated by the respectively derived geometric transformations, the period of time of the acquisition may be subdivided into finer or coarser time segments.

In a further preferred embodiment of the invention, the MR signals are acquired according to a stack-of-stars scheme. In the known so-called three-dimensional (3D) stack-of-stars acquisition scheme (see, e.g., WO 2013/159044 A1), a number of spatially non-selective or slab-selective RF excitations is applied, each followed by the acquisition of one or more MR signals (e.g. gradient echo signals), wherein each MR signal represents a k-space profile. The MR signals are acquired as radial k-space profiles from a number of parallel k-space planes. The slices are arranged at different positions along a direction perpendicular to the directions of the radial k-space profiles. In this direction (typically the $k_z$-direction), standard Cartesian phase-encoding is performed, while the MR signals are acquired within each single slice along radial 'spokes' that are rotated around the center ($k_x=k_y=0$). This results in a cylindrical k-space coverage composed of stacked discs ('stack-of-stars'). Technically, this is realized by generating magnetic field gradients in the in-plane directions of the k-space planes simultaneously and modulating their amplitudes. Different schemes can be used for selecting the temporal order of the k-space profile acquisition steps. E.g., all phase-encoding steps along the slice direction can be acquired sequentially before k-space profiles at different angular positions (rotation angles) are acquired. This ensures that periods of Cartesian sampling are kept short, which leads to high data consistency within the stack of slices and preserves the general motion-robustness of radial sampling for the stack-of-stars approach. The Cartesian phase-encoding steps may be performed from the center slice to the k-space periphery (centric out), or in linear order from $-k_{z,max}$ to $+k_{z,max}$. Optionally, the Cartesian phase-encoding scheme may be selected to sample a central three-dimensional volume of k-space more frequently than peripheral k-space portions. For the angular ordering, the imaging sequence can use either equidistant angular sampling with multiple interleaves or the so-called golden angle-scheme. In the equidistant scheme, the angular distance, i.e. the increment of the rotation angle of the radial k-space profiles is calculated according to $\Delta\Phi=180°/n_{total}$ where $n_{total}$ is the total number of spokes. It may be beneficial to acquire the spokes using multiple interleaves (or 'rotations') because the interleaving reduces temporal coherences in k-space. Thus, motion inconsistencies are spread out in k-space and artifacts are attenuated. In the golden angle-scheme, the rotation angle of the k-space profiles is incremented each time by $\Delta\Phi=111.25°$, which corresponds to 180° multiplied by the golden ratio. Therefore, subsequently sampled spokes always add complementary information while filling the largest gaps within the previously sampled set of spokes. As a consequence, any sequential set of acquired spokes covers k-space approximately uniformly. This facilitates, in particular in combination with a Cartesian phase encoding in the $k_z$-direction which also samples the central volume of k-space more closely in time as compared to the peripheral portions, the reconstruction of low-resolution MR images for each time segment according to the invention for deriving the geometric transformation for each pair of consecutive time segments.

Similarly, in the also known stack-of-spirals acquisition scheme, each non-selective or slab-selective RF excitation is followed by the acquisition of one or more MR signals that represent spiral k-space profiles. Like in the stack-of-stars method, the planar spirals are arranged at different positions along a direction perpendicular to the planes of the spirals in k-space, wherein standard Cartesian phase-encoding is performed in the direction perpendicular to the planes, while the MR signals are acquired within each single plane along spiral trajectories having their origin in the k-space center ($k_x=k_y=0$).

The afore-described 3D radial stack-of-stars and stack-of-spirals schemes offer several advantages for clinical 3D and 4D MR imaging like high intrinsic motion-robustness and benign aliasing artifacts.

The MR signals may also be sampled according to a so-called "koosh ball"-sampling scheme. This techniques provides for virtually silent MR imaging, in which RF excitation as well as acquisition of MR signals are performed in the presence of a magnetic field gradient. The magnetic field gradient is applied for purely frequency-encoded, radial centre-out k-space encoding. The spatially non-selective excitation must uniformly cover the full frequency bandwidth spanned by the readout magnetic field gradient, which is typically accomplished by radiating short, hard RF pulses. The acquisition of a free induction decay (FID) signal starts immediately after radiation of the RF pulse. After the FID readout, only minimal time is required for setting of the next readout magnetic field gradient before the next RF pulse can be applied, thus enabling very short repetition times (TR). The magnetic field gradient vector determining the readout direction is incrementally varied from repetition to repetition until a spherical volume in k-space is sampled to the required extent. Such radial centre-out k-space scanning techniques are referred to as "koosh ball"-scanning, with the radial k-space "spokes" and their arrangement in k-space resembling the filaments (strings) of the known toy ball design. Without the need for switching off the readout magnetic field gradient during the whole scan, MR imaging can be performed virtually silently (see, for example, Weiger et al, Magnetic Resonance in Medicine, vol. 70, p. 328-332, 2013).

In further possible embodiments of the invention, the imaging sequence employed by the method of the invention may be, for example, a turbo field echo (TFE) sequence or a balanced (turbo) field echo sequence or an echo planar imaging (EPI) or a turbo spin echo (TSE) sequence or GRASE sequence.

The method of the invention described thus far can be carried out by means of a MR device including at least one main magnet coil for generating a uniform, steady magnetic field $B_0$ within an examination volume, a number of gradient coils for generating switched magnetic field gradients in different spatial directions within the examination volume, at least one body RF coil for generating RF pulses within the examination volume and/or for receiving MR signals from a body of a patient positioned in the examination volume, a host computer for controlling the temporal succession of RF pulses and switched magnetic field gradients, and a reconstructing processor for reconstructing MR images from the received MR signals. The method of the invention can be implemented by a corresponding programming of the reconstructing processor and/or the host computer of the MR device.

The method of the invention can be advantageously carried out on most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the host computer of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
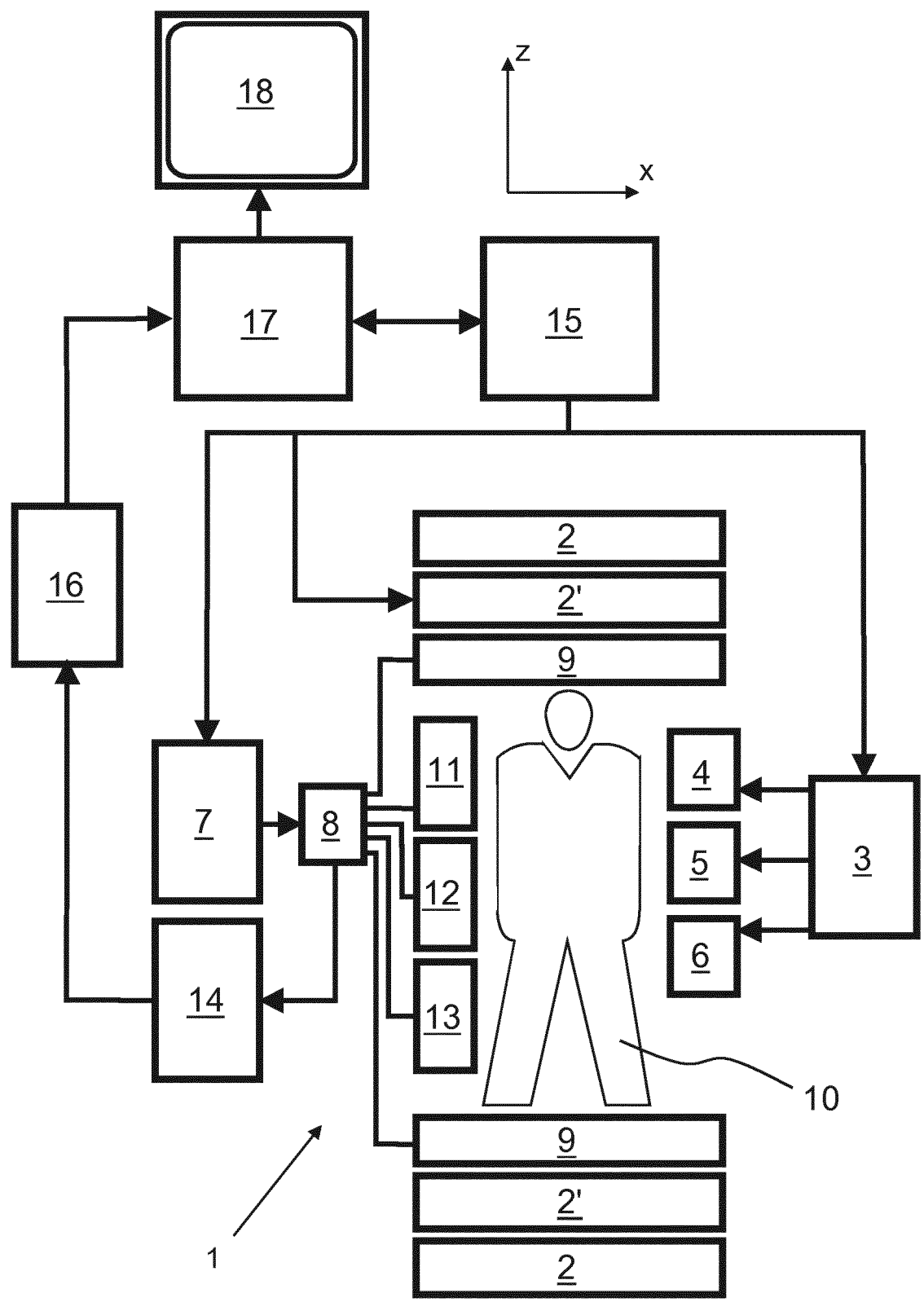
FIG. 1 shows a block diagram of a MR device for carrying out the method of the invention.

With reference to FIG. 1, a MR device 1 is shown as a block diagram. The device comprises superconducting or resistive main magnet coils 2 such that a substantially uniform, temporally constant main magnetic field $B_0$ is created along a z-axis through an examination volume. The device further comprises a set of ($1^{st}$, $2^{nd}$ and—where applicable—$3^{rd}$ order) shimming coils 2', wherein the current flow through the individual shimming coils of the set of shimming coils 2' is controllable for the purpose of minimizing $B_0$ deviations within the examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient amplifier 3 applies current pulses or waveforms to selected ones of whole-body gradient coils 4, 5 and 6 along x, y and z-axes of the examination volume. A digital RF frequency transmitter 7 transmits RF pulses or pulse packets, via a send/receive switch 8, to a body RF coil 9 to transmit RF pulses into the examination volume. A typical MR imaging sequence is composed of a packet of RF pulse segments of short duration which, together with any applied magnetic field gradients, achieve a selected manipulation of nuclear magnetic resonance signals. The RF pulses are used to saturate, excite resonance, invert magnetization, refocus resonance, or manipulate resonance and select a portion of a body 10 positioned in the examination volume. The MR signals are also picked up by the body RF coil 9.

For generation of MR images of limited regions of the body 10 or for scan acceleration by means of parallel imaging, a set of local array RF coils 11, 12, 13 are placed contiguous to the region selected for imaging. The local array RF coils 11, 12, 13 can be used to receive MR signals induced by body-coil RF transmissions.

The resultant MR signals are picked up by the body RF coil 9 and/or by the local array RF coils 11, 12, 13 and demodulated by a receiver 14 preferably including a preamplifier (not shown). The receiver 14 is connected to the RF coils 9, 11, 12 and 13 via send/receive switch 8.

A host computer 15 controls the shimming coils 2' as well as the gradient amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data are reconstructed into an image representation by a reconstruction processor 17 which applies a Fourier transform or other appropriate reconstruction algorithms, such as SENSE or GRAPPA. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

The host computer 15 is programmed to execute the method of the invention described herein above and in the following.

Figure 2:
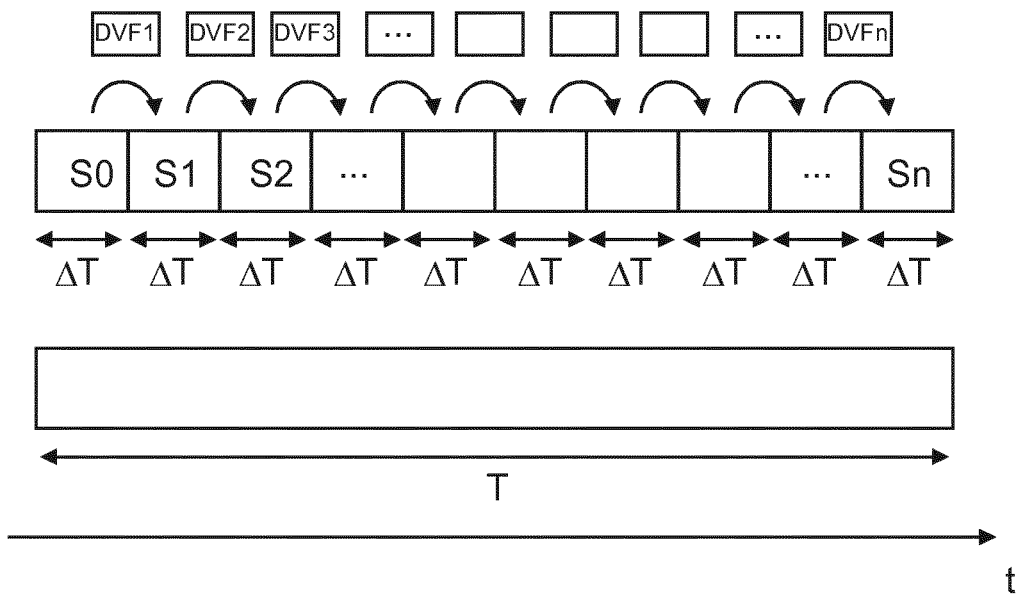
FIG. 2 schematically illustrates the subdivision of the acquisition time period into time segments according to the invention.
Figure 3:
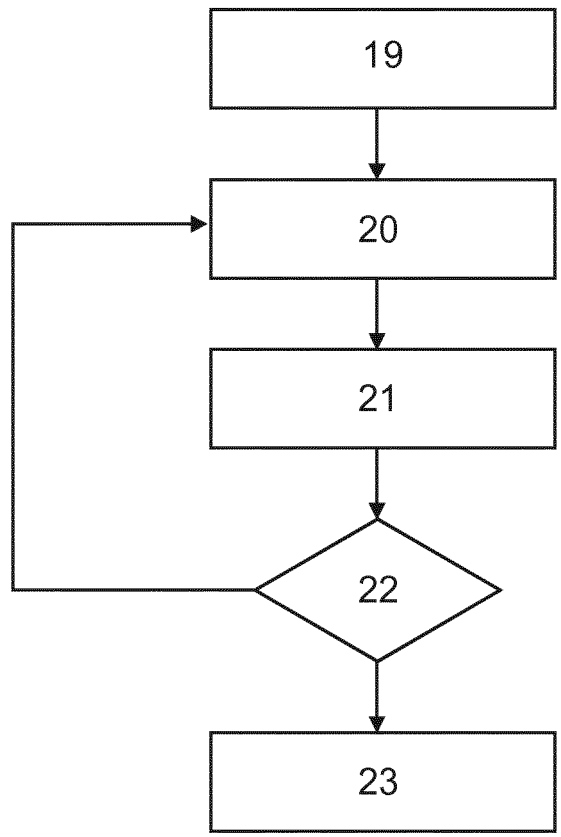
FIG. 3 shows the method of the invention as a flow diagram.

According to the invention, MR signals are acquired in step 19 (see FIG. 3) over a given period of time, e.g. in a golden angle stack-of-stars scheme with interleaved profile order as described above. In step 20, the period of time is subdivided into a number of successive time segments. This is schematically illustrated in FIG. 2. The period of time over which MR signals are acquired is indicated by T in FIG. 2. The period of time T is subdivided into a number of shorter time segments S0, S1, S2, . . . Sn, each of duration $\Delta T$. The duration of each time segment $\Delta T$ may be 0.5 s, for example. This is typically short enough in the case of normal respiratory motion, such that motion within one time segment can be neglected. A low-resolution three-dimensional MR image is reconstructed for each time segment in step 21 from the signal data of each time segment. This is possible since about 10-15 radial k-space spokes are typically available within 0.5 s due to the interleaved profile order. Moreover, step 21 includes the derivation of a geometric transformation in image space for each pair of consecutive time segments S0, S1, S2, Sn, which geometric transformation reflects motion occurring between the two time segments of the respective pair. The geometric transformation is derived by estimation of a deformation vector field DVF1, DVF2, ... DVFn for each pair of consecutive low resolution MR images. From the deformation vector fields DVF1, DVF2, ... DVFn the geometric transformation reflecting motion between arbitrary time segments can be computed by summing all deformation vector field of the spanned segments:

DVF(i→j)=DVFi+1+DVFi+2+ . . . +DVFj

In step 22, inconsistency of the signal data is computed for all time segments. If there is a correlation between high inconsistency within a certain time segment Si and a large amplitude of the corresponding deformation vector field DVFi the likely reason for this is fast motion. In this case, the subdivision into time segments in step 20 is repeated with a shorter duration ΔT. Alternatively, the respective time segment Si is split into multiple shorter time segments. The geometric transformations between the shorter time segments can be obtained by interpolating between the deformation vector fields DVF1, DVF2, . . . DVFn of the original subdivision. In this way, the duration of the time segment Si is shortened and the inconsistency within the time segment Si is reduced. Reversely, time segments Si may be combined if data consistency is high and the amplitudes of the deformation vector field is small. This implies negligible motion, and the combination of time segments increases the amount of available data for the iterative reconstruction and also increases convergence speed. In step 23, an MR image is reconstructed by an iterative reconstruction technique from the signal data, wherein a motion compensation is applied according to the derived geometric transformations. The iterative reconstruction is initialized with an MR image which is reconstructed conventionally from the full set of MR signal data acquired over the time period T. This MR image will likely have low quality because it is blurred by motion. This initial MR image will then be iteratively refined. To this end, as a next step, an index of a time segment S0, S1, S2, Sn is selected. Different strategies may be employed to choose the processing order of the time segments. In the case of a scan with application of a contrast agent, a linear order will be preferred because this takes the temporal continuity in contrast agent concentration change into account. In the case of a free breathing scan without contrast agent, it may be advantageous to choose the processing sequence according to the similarity of the low-resolution MR images attributed to the time segments. The similarity can be quantified using the derived deformation vector fields DVF1, DVF2, . . . DVFn. The MR image is then transformed according to the geometric transformation corresponding to the motion state of the respectively selected index. The MR image is then updated and brought into conformity with the signal data attributed to the time segment of the selected index, for example by applying a number of iterations of a standard iterative SENSE algorithm. After iterating through the indexes of all time segments in this fashion, a high quality MR image is obtained that contains contributions from the full set of signal data. In addition to the MR image, the method yields motion transforms which allow transforming the MR image into all motion states of the different time segments. Furthermore, the reconstruction process can be repeated through all time segments after the first pass, wherein the geometric transformations are applied in each iteration in such a fashion that a high quality MR image is reconstructed for every time segment and, thus, motion state.

Optionally, the assumption that motion within each time segment is negligible can be quantified and tested by computing the inconsistency of all signal data within a time segment. If the inconsistency is low, the assumption that motion during the respective time segment can be neglected is valid, if it is high on the other hand, the respective time segment can be excluded from the reconstruction. This situation may occur as an exception, for example in the case of incidental gross motion, swallowing, coughing etc.

A further option is to gradually increase the resolution of the reconstructed MR image during the iterative reconstruction process from coarse to fine as the number of iterations increases. Many iterations may be required to progress from the blurred initial MR image to the final high quality MR image. In this situation, computation time can be saved by performing the initial iterations on an MR image of lower resolution (fewer voxels). A small number of voxels may be sufficient to represent the full information of the blurred initial image.

The invention claimed is:

1. A method of magnetic resonance (MR) imaging of an object positioned in the examination volume of an MR device, the method comprising:
   generating MR signals by subjecting the object to an imaging sequence comprising RF pulses and switched magnetic field gradients;
   acquiring the MR signals as signal data over a given period of time; in which data portions are sampled from different portions of k-space, of magnetic resonance signals for successive time segments;
   subdividing the period of time into a number of successive time segments such that no or only negligible motion occurs within each time segment;
   deriving geometric transformations) in image space for each pair of consecutive time segments (, which geometric transformation reflects motion occurring between the two time segments of the respective pair;
   reconstructing respective MR images for the respective instants of the individual time segments from the signal data of several time segments, wherein a motion compensation is applied to the data portions from the respective time segments for each instant according to the derived respective geometric transformations between said individual time segments and said instant, and
   determining an inconsistency of the MR signals attributed to each time segment, wherein the period of time is subdivided into a larger number of shorter time segments when inconsistency is detected.

2. A magnetic resonance (MR) device comprising at least one main magnet coil for generating a uniform, steady magnetic field $B_0$ within an examination volume; gradient coils for generating switched magnetic field gradients in different spatial directions within the examination volume; at least one RF coil for generating RF pulses within the examination volume and/or for receiving MR signals from an object positioned in the examination volume; a host computer adapted to control the temporal succession of RF pulses and switched magnetic field gradients; and a reconstructing processor for reconstructing MR images from the received MR signals, wherein the MR device is arranged to perform a method, comprising:
   generating MR signals by subjecting the object to an imaging sequence comprising RF pulses and switched magnetic field gradients;
   acquiring the MR signals as signal data over a given period of time, in which data portions are sampled from different portions of k-space, of magnetic resonance signals for successive time segments;

c) subdividing the period of time into a number of successive time segments such that no or only negligible motion occurs within each time segment;

deriving a geometric transformation in image space for each pair of consecutive time segments, which geometric transformation reflects motion occurring between the two time segments of the respective pair; and reconstructing respective MR images for the respective instants of the individual time segments from the signal data, wherein a motion compensation is applied to the data portions from the respective time segments for each instant according to the derived respective geometric transformations between said individual time segments and said instant, wherein the period of time is subdivided into a larger number of shorter time segments or a shorter number of longer time segments when at least one of the derived geometric transformations indicates a too fast or too strong motion occurring between the two time segments of the respective pair.

3. A computer program to be run on a magnetic resonance (MR) device, which computer program comprises executable instructions stored on a non-transitory computer readable medium, and configured to:

generate an imaging sequence comprising RF pulses and switched magnetic field gradients;

acquire MR signals as signal data over a given period of time (T), in which data portions are sampled from different portions of k-space, of magnetic resonance signals for successive time segments;

subdividing the period of time into a number of successive time segments such that no or only negligible motion occurs within each time segment;

deriving a geometric transformation in image space for each pair of consecutive time segments, which geometric transformation reflects motion occurring between the two time segments of the respective pair; and reconstructing respective MR images for the respective instants of the individual time segments from the signal data, wherein a motion compensation is applied to the data portions from the respective time segments for each instant according to the derived respective geometric transformations between said individual time segments and said instant, wherein the period of time is subdivided into a smaller number of longer time segments or a larger number of shorter time segment when the derived geometric transformations indicate that there is no or only an insignificant motion occurring between consectutive time segments.

4. The method of claim 1, further comprising reconstructing a low-resolution MR image is reconstructed for each time segment from the signal data attributed to the respective time segment.

5. The method of claim 4, further comprising deriving each of the geometric transformations as a displacement vector field by registering the low-resolution MR images of the respective pair with each other.

6. The method of claim 1, wherein a motion state is attributed to each time segment and an MR image is reconstructed for each motion state.

7. The method of claim 1, wherein an iterative reconstruction technique is applied for reconstructing the MR images.

8. The method of claim 7, wherein the reconstruction iteratively refines the reconstructed MR images, wherein, for each time segment, the geometric transformation attributed to the respective time segment is applied and the MR image is brought into agreement with the signal data attributed to the respective time segment.

9. The method of claim 1, wherein the period of time is subdivided into a larger number of shorter time segments when at least one of the derived geometric transformations indicates a too fast or too strong motion occurring between the two time segments of the respective pair.

10. The method of claim 1, wherein the period of time is subdivided into a smaller number of longer time segments when the derived geometric transformations indicate that there is no or only an insignificant motion occurring between consecutive time segments.

11. The method of claim 1, wherein the MR signals are acquired according to a stack-of-stars or stack-of-spirals scheme, or according to a koosh ball-scanning scheme.

12. The method of claim 1, further comprising the reconstruction of a dynamic series of MR images.

13. The method of claim 1, wherein the MR signals are acquired by parallel imaging using a number of RF receiving coils having different spatial sensitivity profiles.

14. The method of claim 8, wherein the MR images are reconstructed by iterative SENSE reconstruction.

15. The computer program of claim 3, wherein the method further comprises reconstructing a low-resolution MR image is reconstructed for each time segment from the signal data attributed to the respective time segment.

16. The MR device claim 2, wherein a low-resolution MR image is reconstructed for each time segment from the signal data attributed to the respective time segment.

17. The MR device of claim 16, wherein each of the geometric transformations is derived as a displacement vector field by registering the low-resolution MR images of the respective pair with each other.

18. The MR device of claim 2, wherein a motion state is attributed to teach time segment and an MR image is reconstructed for each motion state.

19. The MR device of claim 2, wherein an iterative reconstruction technique is applied for reconstructing the MR images.

20. The MR of claim 19, wherein the reconstruction iteratively refines the reconstructed MR images, wherein, for each time segment, the geometric transformation attributed to the respective time segment is applied and the MR image is brought into agreement with the signal data attributed to the respective time segment.

* * * * *